(12) United States Patent
Tanzawa

(10) Patent No.: US 9,285,997 B2
(45) Date of Patent: Mar. 15, 2016

(54) INDEPENDENTLY SELECTIVE TILE GROUP ACCESS WITH DATA STRUCTURING

(71) Applicant: INTEL CORPORATION, Santa Clara, CA (US)

(72) Inventor: Toru Tanzawa, Tokyo (JP)

(73) Assignee: INTEL CORPORATION, Santa Clara, CA (US)

( * ) Notice: Subject to any disclaimer, the term of this patent is extended or adjusted under 35 U.S.C. 154(b) by 190 days.

(21) Appl. No.: 14/067,861

(22) Filed: Oct. 30, 2013

(65) Prior Publication Data

US 2015/0121000 A1 Apr. 30, 2015

(51) Int. Cl.

| | |
|---|---|
| *G06F 12/00* | (2006.01) |
| *G06F 13/00* | (2006.01) |
| *G06F 13/28* | (2006.01) |
| *G06F 3/06* | (2006.01) |
| G06F 9/38 | (2006.01) |
| G06F 12/02 | (2006.01) |
| G11C 11/408 | (2006.01) |

(52) U.S. Cl.
CPC .............. *G06F 3/0611* (2013.01); *G06F 3/064* (2013.01); *G06F 3/0689* (2013.01); *G06F 9/3897* (2013.01); *G06F 12/0246* (2013.01); *G11C 11/4087* (2013.01)

(58) Field of Classification Search
CPC ............ G06F 2212/7201; G06F 3/064; G06F 12/0246; G06F 9/3895; G06F 9/3897; G06F 12/0607; G11C 11/4085; G11C 11/4087
See application file for complete search history.

(56) References Cited

U.S. PATENT DOCUMENTS

| 5,828,621 A | 10/1998 | Tanzawa et al. | |
|---|---|---|---|
| 2002/0103959 A1* | 8/2002 | Baker et al. | 711/103 |
| 2012/0124324 A1* | 5/2012 | Park et al. | 711/206 |
| 2013/0163305 A1 | 6/2013 | Tanzawa | |
| 2014/0351529 A1* | 11/2014 | Wells | G06F 3/064 |
| | | | 711/157 |

OTHER PUBLICATIONS

Tanzawa et al., "Circuit Techniques for a 1.8-V-Only NAND Flash Memory," IEEE Journal of Solid-State Circuits, vol. 37, No. 1, Jan. 2002, pp. 84-89.

* cited by examiner

*Primary Examiner* — Ryan Bertram
(74) *Attorney, Agent, or Firm* — Schwabe Williamson & Wyatt PC

(57) ABSTRACT

Embodiments of the present disclosure include data structuring techniques and configurations for memory access. In one embodiment, an apparatus includes a plurality of tiles, a plurality of blocks, wherein individual tiles of the plurality of tiles and individual blocks of the plurality of blocks each include a plurality of tile blocks having memory elements and wherein the plurality of tile blocks are accessible for read or write according to a tile address to identify a tile of the plurality of tiles and a block address to identify a block of the plurality of blocks and a data restructuring module configured to modify, based on the tile address, an order of data to be read from or written to the tile blocks. Other embodiments may be described and/or claimed.

19 Claims, 8 Drawing Sheets

INDEPENDENTLY SELECTIVE TILE GROUP ACCESS WITH DATA STRUCTURING

FIELD

Embodiments of the present disclosure generally relate to the field of integrated circuits, and more particularly, to data structuring techniques and configurations for memory access.

BACKGROUND

Presently, a memory device such as, for example, three-dimensional (3D) flash memory may increase bit density by stacking multiple layers of memory elements in the memory device. Increasing the bit density in this manner may increase a block size of the memory by increasing a number of sub-blocks per block, which may result in reduced usability of the memory device. In present memory access schemes, accessing a sector of a first block and another sector of a second block may require two accesses. For example, each block address and access (e.g., command input for read or write) may be input twice. Accordingly, present memory access techniques may result in longer access time and more consumption of energy in the memory device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure include data structuring techniques and configurations for memory access such as independently selective tile group access. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine and/or other suitable components that provide the described functionality.

Figure 1:
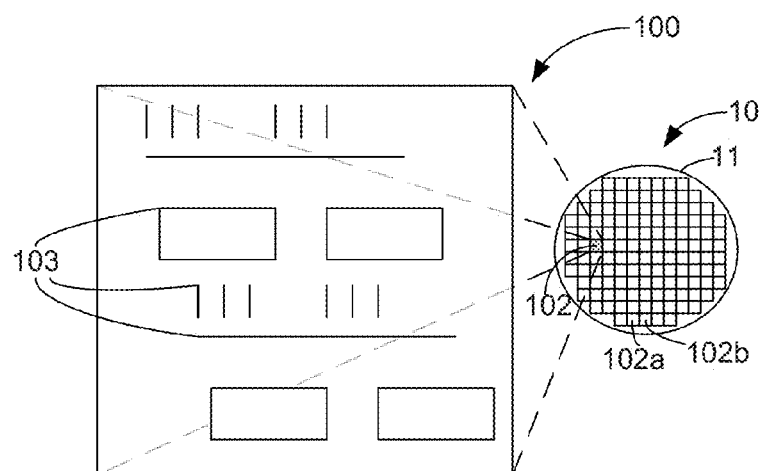
FIG. 1 schematically illustrates a top view of an example die in wafer form and in singulated form, in accordance with some embodiments.

FIG. 1 schematically illustrates a top view of an example die 102 in wafer form 10 and in singulated form 100, in accordance with some embodiments. In some embodiments, the die 102 may be one of a plurality of dies (e.g., dies 102, 102a, 102b) of a wafer 11 composed of semiconductor material such as, for example, silicon or other suitable material. The plurality of dies may be formed on a surface of the wafer 11. Each of the dies may be a repeating unit of a semiconductor product such as, for example, memory having one or more modules (e.g., memory access configurations as described in connection with FIGS. 3-9) that are configured to perform techniques as described herein. For example, one or more modules of the die 102 may include circuitry 103 that is configured to perform memory access and/or data restructuring for memory access as described herein. The one or more modules may be further configured to perform read or write operations as described herein. For example, the circuitry 103 may be configured to perform actions described in connection with FIG. 10 or 11 or elsewhere herein. In some embodiments, the circuitry 103 may be formed using complementary metal-oxide-silicon (CMOS) fabrication techniques and other suitable semiconductor fabrication techniques. The circuitry 103 is only schematically depicted in FIG. 1 and is intended to represent a wide variety of suitable logic in the form of circuitry including, for example, one or more state machines including circuitry and/or instructions in storage (e.g., firmware or software) configured to perform the actions described herein when executed.

After a fabrication process of the semiconductor product is complete, the wafer 11 may undergo a singulation process in which each of the dies (e.g., dies 102, 102a, 102b) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the circuitry 103 may be disposed on a semiconductor substrate in wafer form 10 or singulated form 100.

In some embodiments, the die 102 may represent multi-level cell (MLC) flash memory such as, for example, three-dimensional (3D) NAND flash memory. The die 102 may represent other suitable types of memory in other embodiments such as, for example, single-level cell (SLC) flash memory. The die 102 may include logic or memory, or combinations thereof.

Figure 2:
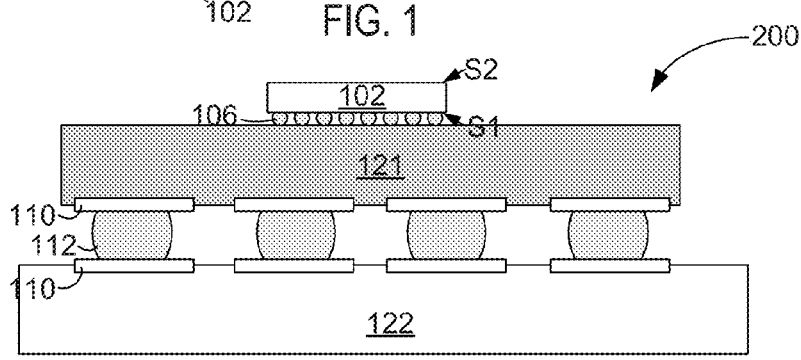
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. The die 102 may include one or more modules (e.g., circuitry 103 of FIG. 1) configured to perform actions described herein. In some embodiments, the package substrate 121 may be coupled with a circuit board 122, as can be seen.

The die 102 may represent a discrete product made from a semiconductor material (e.g., silicon) using semiconductor fabrication techniques such as thin film deposition, lithography, etching and the like used in connection with forming CMOS devices. In some embodiments, the die 102 may be, include, or be a part of a processor, memory, system-on-chip (SoC) or ASIC in some embodiments. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include circuitry such as, for example, transistor devices. An inactive side, S2, may be disposed opposite to the active side S1, as can be seen. In other embodiments, the die 102 may be disposed on another die that is coupled with the package substrate 121 in any of a variety of suitable stacked die configurations. For example, a processor die may be coupled with the package substrate 121 in a flip-chip configuration and the die 102 may be mounted on the processor die in a flip-chip configuration and electrically coupled with the package substrate 121 using through-silicon vias (TSVs) formed through the processor die. In still other embodiments, the die 102 may be embedded in the package substrate 121 or coupled with a die that is embedded in the package substrate 121. Other dies may be coupled with the package substrate 121 in a side-by-side configuration with the die 102 in other embodiments.

In some embodiments, the die-level interconnect structures 106 may be configured to route electrical signals between the die 102 and the package substrate 121. The electrical signals may include, for example, input/output (I/O) signals and/or power/ground signals that are used in connection with operation of the die. The die-level interconnect structures 106 may be coupled with corresponding die contacts disposed on the active side S1 of the die 102 and corresponding package contacts disposed on the package substrate 121. The die contacts and/or package contacts may include, for example, pads, vias, trenches, traces and/or other suitable contact structures.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, package contacts (e.g., pads 110) disposed on one or more surfaces of the package substrate 121 and/or internal routing features (not shown) such as, for example, trenches, vias or other interconnect structures to route electrical signals through the package substrate 121.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 1202 of FIG. 12).

Package-level interconnects such as, for example, solder balls 112 may be coupled to pads 110 on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. The package-level interconnects may include other structures, materials and/or configurations including, for example, land-grid array (LGA) structures and the like.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3:
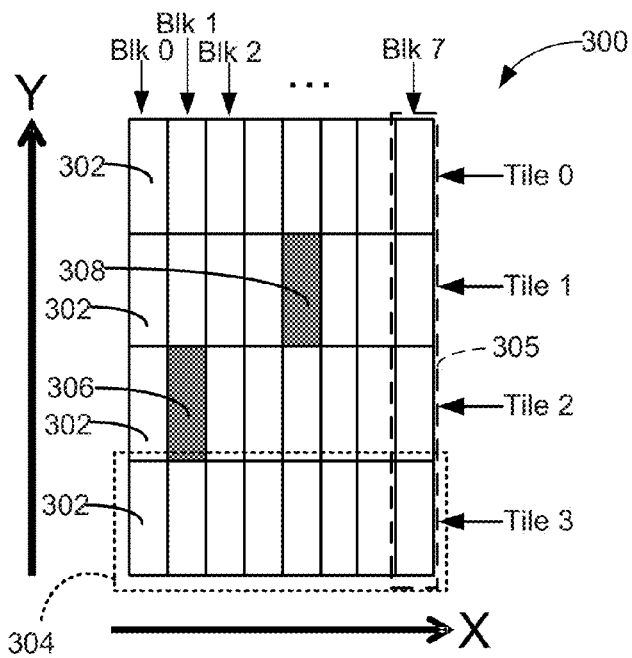
FIG. 3 schematically illustrates an example memory configuration, in accordance with some embodiments.

FIG. 3 schematically illustrates an example memory configuration 300, in accordance with some embodiments. According to various embodiments, the memory configuration 300 may include a plurality of tile blocks (hereinafter "tile blocks 302") that may be configured in an array and accessed on a tile block basis according to a block address (e.g., Blk 0, Blk 1, Blk 2 . . . Blk 7, etc.) in an x-direction and a tile address (e.g., Tile 0, Tile 1, Tile 2, Tile 3, etc.) in a y-direction that is perpendicular to the x-direction, as can be seen. In some embodiments, bitlines (e.g., bitlines 416 of FIG. 4) may extend in the x-direction and wordlines (e.g., local wordlines 428 of FIG. 4) may extend in the y-direction. The x-direction and y-direction may each represent a horizontal direction that extends in a direction that is parallel or substantially parallel with a plane formed by an active surface of a memory die (e.g., active side S1 of die 102 of FIG. 1), in some embodiments.

The tile address may indicate a tile unit or individual tile (hereinafter "tile 304") of a plurality of tiles and the block address may indicate a block unit or individual block (hereinafter "block 305") of a plurality of blocks. Each tile 304 of the plurality of tiles may include a plurality of tile blocks 302 arranged in the y-direction and each block 305 of the plurality of blocks may include a plurality of tile blocks 302 arranged in the x-direction, for example, as can be seen in FIG. 3. A single tile block of the tile blocks 302 may be accessed for read or write according to a block address (e.g., Blk 7) that identifies a single block (e.g., block 305) and a tile address (e.g., Tile 3) that identifies a single tile (e.g., tile 304). A single tile and a single block may have a same or different number of bits, according to various embodiments. Each tile block of the tile blocks 302 may have memory elements for read/write access such as, for example, memory cells representing bits of memory. Tile blocks 302 in a single tile (e.g., tile 304) may have a same tile address (e.g., Tile 3) and share bitlines and tile blocks 302 in a single block (e.g., block 305) may have a same block address (e.g., Blk 7) and separate wordlines (e.g., See memory access configuration 400 of FIG. 4).

In some embodiments, a tile block of the plurality of tile blocks 302 may be selected for memory access according to a tile address to identify a y-coordinate of the tile block and a block address to identify an x-coordinate of the tile block. Memory access may refer to transfer of data to or from the tile block such as read or write operations in some embodiments. In some embodiments, the tile address may be provided by a most significant bit (MSB) of a column address and the block address may be provided by a least significant bit (LSB) of a column address, or vice versa. In a case where column address is provided with N-bits of column address (CA)<N−1:0>, the tile address may be lower (N−m)-bit(s) of CA<N−m−1, . . . , 0> and the column in each tile 304 may be upper m-bit(s) of CA<N−1, . . . , N−m>, where m is an integer (e.g., 1 or 2 or . . . or (N−1)). A number of bitlines per tile may be $2^m$ bytes and a number of tiles may be $2^{(N-m)}$, in some embodiments. Block address may be independent of tile address in some embodiments.

For example, in a case where a host device intends to access a first sector (e.g., of highlighted tile block 306 of Blk 1, Tile 2) and a second sector (e.g., of highlighted tile block 308 of Blk 4, Tile 1) for a write operation, a write sequence according to some embodiments may include a data load (DL) command, first block address (BA1), first tile address (TA1), row address (RA), input, followed by second block address (BA2), second tile address (TA2), row address (RA), input, followed by data load of combination of data 1 (D1) and data 2 (D2), followed by write command (e.g., program (PGM)) input, where BA1, TA1 and D1 correspond with access of the first sector and BA2, TA2 and D2 correspond with access of the second sector. In a case where a host device intends to access a first sector (e.g., of highlighted tile block 306 of Blk 1, Tile 2) and a second sector (e.g., of highlighted tile block 308 of Blk 4, Tile 1) for a read operation, a read sequence according to some embodiments may include a read command (RD) input, BA1, TA1, RA, input, followed by BA2, TA2, RA, page read (PR) command input, followed by data read out with combination of data 1 (D1) and data 2 (D2). The first sector or second sector may be, for example, a 4 kilobyte (KB) group of memory within a tile block in some embodiments.

The memory configuration 300 may allow independently selective tile group access according to techniques described herein to increase bandwidth and/or decrease energy per bit in a memory device (e.g., 3D NAND flash memory). Accessing the first sector and the second sector according to techniques described herein may reduce access time and, thus, energy consumption associated with access. For example, tile blocks 306 and 308 may be selected simultaneously for access (e.g., single, simultaneous access) resulting in faster access and less energy compared with a memory configuration where each of tile blocks 306 and 308 are accessed once, in turn. Access time according to present embodiments may be about twice that of a memory configuration where each of tile blocks 306 and 308 are accessed once, in turn.

Figure 3A:
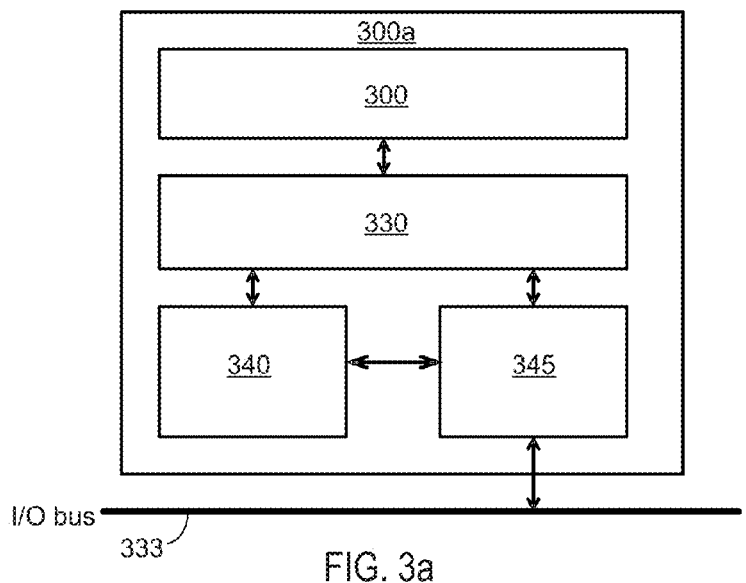
FIG. 3a schematically illustrates functionality of an example memory die, in accordance with some embodiments.

FIG. 3*a* schematically illustrates functionality of an example memory die 300*a*, in accordance with some embodiments. The memory die 300*a* may comport with embodiments described in connection with die 102 of FIG. 1. In some embodiments, the memory die 300*a* includes a cell array including tiles, blocks and tile blocks such as, for example, memory configuration 300 and control circuitry 330 coupled with the memory configuration to select tile blocks for memory access. The control circuitry 330 may include, for example, sensing circuitry and/or address latches. The control circuitry 330 may be coupled with an input/output (I/O) interface 345 of the memory die 300*a*. Command, address and write data may be input via the I/O bus 333 from a memory controller, which may reside on a separate chip in some embodiments. Read or write sequence may be executed by a controller 340 inside the memory die 300*a*.

Figure 4:
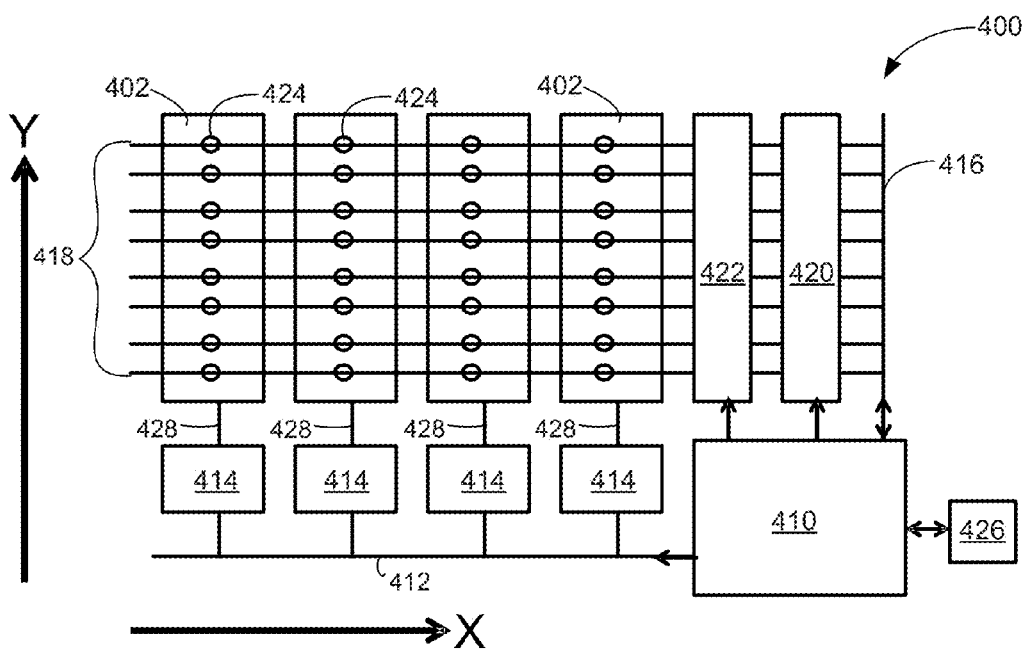
FIG. 4 schematically illustrates an example memory access configuration, in accordance with some embodiments.

FIG. 4 schematically illustrates an example memory access configuration 400, in accordance with some embodiments. According to various embodiments, the memory access configuration 400 may include tile blocks 402, which may comport with embodiments described in connection with tile blocks 302 of FIG. 3 and memory elements 424, which may be accessed according to a tile address and block address according to techniques described in connection with FIG. 3. In some embodiments, the memory access configuration 400 may represent a tile configuration for a single tile. For example, the tile blocks 402 of FIG. 4 may represent tile blocks within tile 304 of FIG. 3 in an embodiment. Each tile of a plurality of tiles (e.g., Tile 0, Tile 1, Tile 2, Tile 3 of FIG. 3) may have a similar configuration as memory access configuration 400. The x-direction and the y-direction of the memory configuration 300 of FIG. 3 are depicted in FIG. 4 to show a dimensional relationship of features of the memory configuration 300 with features of the memory access configuration 400 according to various embodiments.

In some embodiments, the memory access configuration 400 may include a data and/or address control module (hereinafter "data/address control module 410"), which may be coupled with an interface 426 (e.g., input/output interface) of memory and configured to receive data such as, for example, information associated with accessing the memory elements 424 for read or write operations. The data/address control module 410 may be configured to control read or write access to the memory elements. For example, in some embodiments, the data/address control module 410 may include functionality of controller 340 and I/O interface 345 of FIG. 3 in some embodiments. In some embodiments, the data/address control module 410 may be coupled with a global wordline (WL) and block address bus (hereinafter "Global WL/block address 412") that is coupled with local wordlines (WLs) 428. Each of the local WLs 428 may be coupled with a respective tile block decoder and/or address latch (hereinafter "tile block decoder/address latch 414"), which may be configured to latch a block address per tile (e.g., tile 304 of FIG. 3). Each of the tile block decoder/address latches 414 may be coupled with one or more respective tile blocks 402.

A module having functionality to latch block address per tile may be referred to as a "tile block latch" herein. That is, the tile block may specify a block address per tile. Each tile block latch (e.g., tile block decoder/address latch 414) may be coupled with an individual tile block and may be configured to select such individual block for read or write access. In some embodiments, a wordline (e.g., a wordline of local WLs 428) may be coupled with each tile block latch and multiple bitlines (BLs) 418 may be coupled with each individual tile block of the tile blocks 402. The tile latch may allow selection of one or more tile blocks in a tile for read or write access. Tile blocks 402 in a single tile (e.g., tile 304 of FIG. 3) may have a same tile address (e.g., Tile 3 of FIG. 3) and share bitlines 416 and tile blocks 302 in a single block (e.g., block 305 of FIG. 3) may have a same block address (e.g., Blk 7 of FIG. 3) and a separate wordline (e.g., local wordlines 428) for each tile block.

The data/address control module 410 may be further coupled with a data bus 416 to send (e.g., write) or receive (e.g., read) data to or from the memory elements 424. For example, the data bus 416 may be coupled with bitlines 418 that are coupled with the memory elements 424 through a column select module 420 with column address input and sense and data latch module 422. The column select module 420 may input column address such as, for example, CA<N−1:N−m> where a number of bitlines per tile is 2 m bytes. The sense and data latch module 422 may store data read out from the memory cells via bitlines during read and the data input (e.g., from a memory controller) via I/O bus for write. The column select module 420 may select one of $2^m$ sense and data latch modules 422 per clock cycle to send read data to interface 426 and to receive the write data from interface 426. Memory may include other suitable numbers of bitlines per tile in other embodiments.

In some embodiments, the data address control module 410 may be configured to disable one or more tiles that are not identified for read or write access (e.g., no tile address is input or no tile blocks in tile are selected) during a read or write operation of one or more other individual tiles (e.g., tile address is input). For example, a tile may be disabled by not inputting any block address for the tile. Disabling one or more tiles as described may reduce read or write operation time and/or power consumed to perform such operations.

Figure 4A:
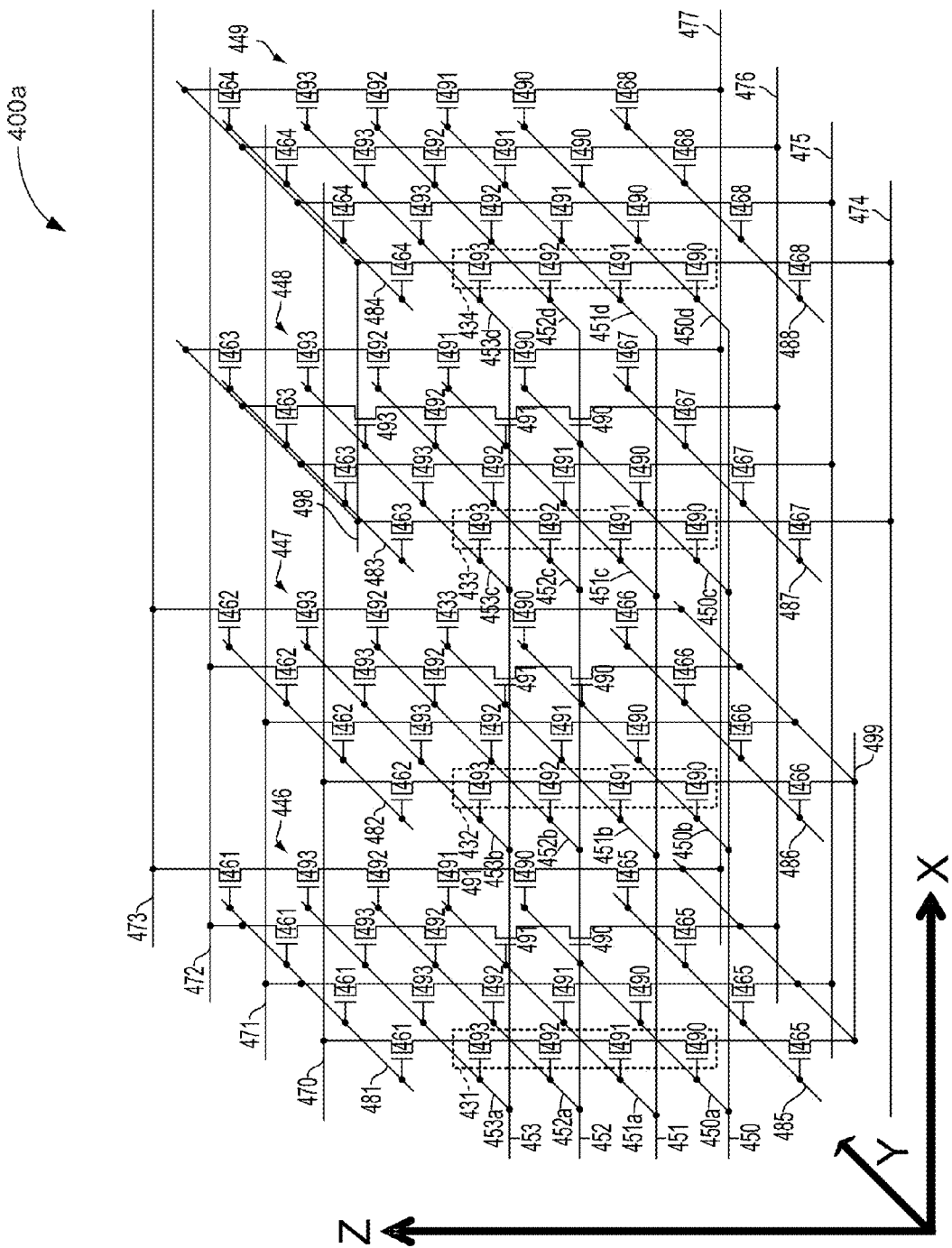
FIG. 4a schematically illustrates a three-dimensional (3D) memory configuration, in accordance with various embodiments.

FIG. 4a schematically illustrates a three-dimensional (3D) memory configuration 400a, in accordance with various embodiments. The x-direction and y-direction of the memory configuration 300 of FIG. 3 are depicted in FIG. 4a in relation to a z-direction, which is perpendicular to both the x-direction and the y-direction, as can be seen. In some embodiments, the z-direction may extend in a direction that is perpendicular or substantially perpendicular with a plane formed by an active surface of a memory die (e.g., active side S1 of die 102 of FIG. 1).

The 3D memory configuration 400a may represent a 3D cell array of a memory die including a plurality of bitlines such as, for example, top bitlines 470, 471, 472, 473 and bottom bitlines 474, 475, 476, 477 that extend in an x-direction. The bitlines 470, 471, 472, 473, 474, 475, 476, 477 may comport with embodiments described in connection with bitlines 416 of FIG. 4. The 3D memory configuration 400a may further include a plurality of wordlines such as, for example, local wordlines 450a-d, 451a-d, 452a-d and 453a-d coupled with respective Global WL/block address lines 450, 451, 452 and 453, as can be seen. The local wordlines 450a-d, 451a-d, 452a-d and 453a-d may comport with embodiments described in connection with local wordlines 428 of FIG. 4 and the Global WL/block address lines 450, 451, 452 and 453 may comport with embodiments described in connection with Global WL/block address 412 of FIG. 4.

The 3D memory configuration 400a may include transistors 490, 491, 492 and 493 coupled with the local wordlines 450a-d, 451a-d, 452a-d and 453a-d and bitlines 470-477, as can be seen. The transistors 490, 491, 492 and 493 may function as memory cells and may be arranged in memory cell strings, such as, for example, memory cell strings 431, 432, 433 and 434. For simplicity, only four (431, 432, 433 and 434) of the 16 memory cell strings in FIG. 4a are labeled. The memory cell strings may include more or fewer transistors and the 3D memory configuration 400a may include more or fewer memory cell strings than depicted in other embodiments. According to various embodiments, each of the transistors 490, 491, 492 and 493 may be configured to store one or more bits.

In some embodiments, each memory cell string may be coupled with two associated transistors among transistors 461, 462, 463, 464, 465, 466, 467, and 468, which may serve as select transistors. Lines 481, 482, 483 and 484 may be coupled with gates of transistors 461, 462, 463 and 464, respectively, and function as select lines to carry select gate signals. Lines 485, 486, 487 and 488 may be coupled with gates of transistors 465, 466, 467 and 468, respectively, and function as select lines to carry select gate signals. The transistors 461, 462, 463, 464, 465, 466, 467, and 468 may be controlled (e.g., turned on or off) by the select gate signals. Source lines 498 and 499 may carry source line signals in the 3D memory configuration 400a.

Memory cell strings coupled with local wordlines 450a-453a (e.g., memory cell string 431) may form a first memory cell set 446a, memory cell strings coupled with local wordlines 450b-453b (e.g., memory cell string 432) may form a second memory cell set 447, memory cell strings coupled with local wordlines 450c-453c (e.g., memory cell string 433) may form a third memory cell set 448 and memory cell strings coupled with local wordlines 450d-453d (e.g., memory cell string 434) may form a fourth memory cell set 449, In some embodiments, each of the memory cell sets (e.g., 446, 447, 448, 449, etc.) may correspond with a separate individual tile block (e.g., tile block 302 of FIG. 3 or tile block 402 of FIG. 4). In some embodiments, the 3D memory configuration 400a may represent four tile blocks addressable by a single tile address and four different block addresses. Other suitable 3D memory configurations may be used in other embodiments.

Figure 5:
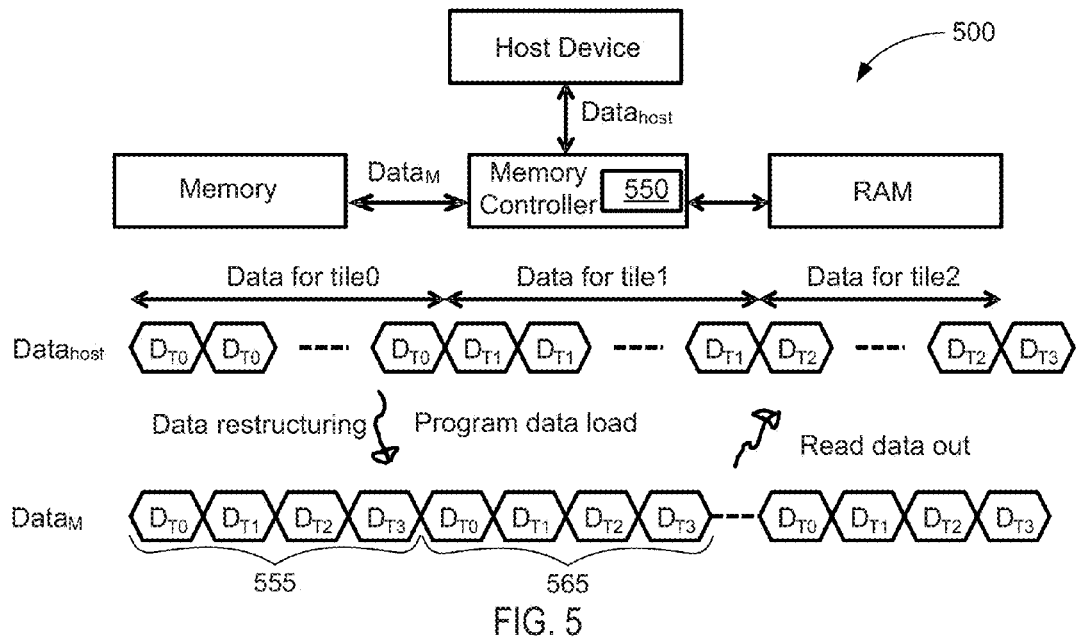
FIG. 5 schematically illustrates an example data management system, in accordance with some embodiments.

FIG. 5 schematically illustrates an example data management system 500, in accordance with some embodiments. In some embodiments, a host device (e.g., a processor) may be coupled to send and/or receive data (hereinafter "$Data_{host}$") to or from a memory controller. The $Data_{host}$ between the host device and the memory controller may be arranged in a sequence such as, for example, data for tile0 ($D_{T0}$)→data for tile 1 ($D_{T1}$)→data for tile 2 ($D_{T2}$)→data for tile 3 ($D_{T3}$), etc., as can be seen in the example sequence depicted in FIG. 5 for $Data_{host}$. That is, in some embodiments, the $Data_{host}$ may include a set of one or more data accesses for tile0, followed by a set of one or more data accesses for tile1, and so forth.

According to some embodiments, the data for each tile (e.g., data for tile0 ($D_{T0}$), data for tile 1 ($D_{T1}$), etc.) may be arranged according to a sequence of rows. For example, data for row address 0 of tile 0 may be followed by data for row address 1 of tile 0, which may be followed by data for row address 2 of tile 0, and so forth. The dashed markings in $Data_{host}$ indicate that data may be presented for any suitable number of rows.

According to various embodiments, the memory controller may include or otherwise may be coupled with a data restructuring module 550 that is configured to modify an order of data (e.g., $Data_{host}$) to be read from or written to the memory (e.g., memory elements 424 of FIG. 4). In some embodiments, the data restructuring module 550 may modify an order of the $Data_{host}$ based on tile address to provide reordered data (hereinafter "$Data_M$") for memory access. For example, the data restructuring module 550 may restructure the $Data_{host}$ received from the host device into $Data_M$ composed of multiple data sets (e.g., data sets 555, 565) each of which may have a same data size as an individual tile block (e.g., one of tile blocks 302 of FIG. 3 or tile blocks 402 of FIG. 4). In some embodiments, the data restructuring module 550 may modify the $Data_{hos}$ into $Data_M$ by allocating only tile addresses that are different from one another into an individual data set of the data sets (e.g., a single data set may include <$D_{T0}$, $D_{T1}$, $D_{T2}$, $D_{T3}$>). In some embodiments, each data set may further include only data for a particular row address. For example, data set 555 may include data for row address 0 of tiles 0, 1, 2 and 3, data set 565 may include data for row address 1 of tiles 0, 1, 2 and 3, and so forth. Thus, data for tile0 ($D_{T0}$) to row address 0 of tile 0 and data for tile1 ($D_{T1}$) for row address 0 of tile 1 can be written or read simultaneously, in one write time (e.g., a single access). The arrangement of $Data_M$ as depicted in FIG. 5 may represent an order of rearranged data for an embodiment where a tile block (e.g., one of tile blocks 302 of FIG. 3 or tile blocks 402 of FIG. 4) is specified by a least significant bit of column address.

In some embodiments, the memory controller and/or data restructuring module 550 may be coupled with other storage such as, for example, random access memory (RAM). The RAM may be configured to store information associated with modification of the order of data by the restructuring module. For example, in a case where the $Data_{host}$ received by the memory controller is not a multiple of unit sector size, the memory controller may add extra bits to data for one or more (e.g., all) of each block to make the data structure manageable. The RAM can be used for temporary storage of data in connection with such data restructuring in some embodiments.

In other embodiments, the data restructuring module 550 may be disposed in memory (e.g., part of a same die as the memory) or otherwise coupled with the memory. In some embodiments, the memory controller and the memory may be components of a same die and similar principles of operation described in connection with the memory controller be performed directly by a die that includes functionality of the memory controller (e.g., data restructuring module 550).

Figure 6:
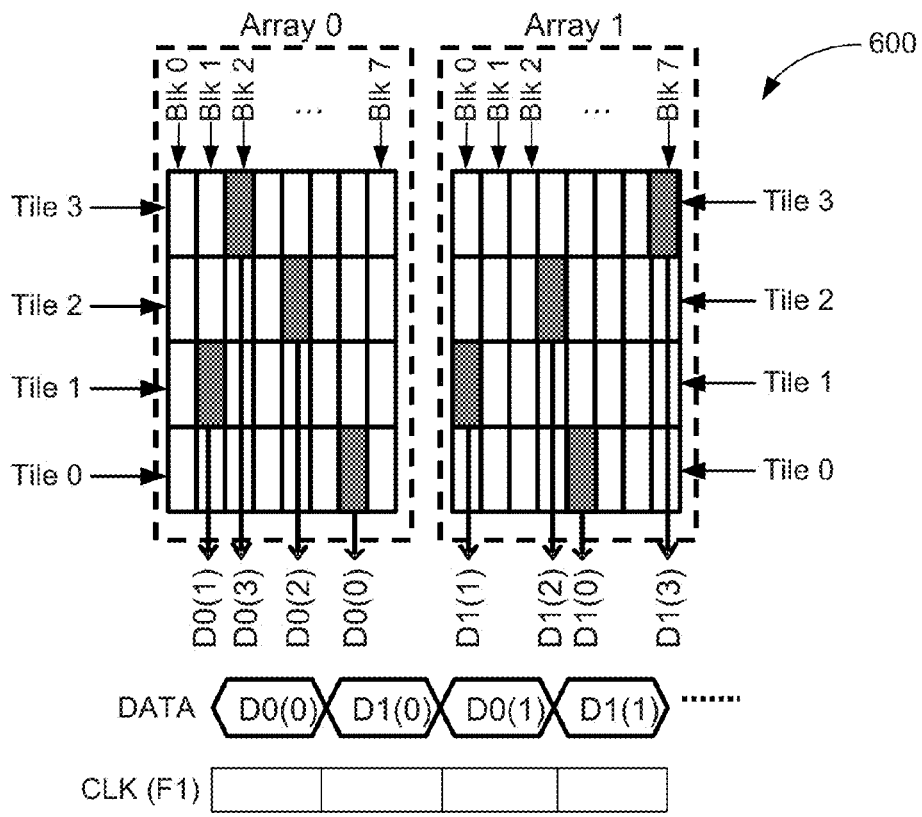
FIG. 6 schematically illustrates an example memory access scheme according to a first embodiment, in accordance with some embodiments.
Figure 7:
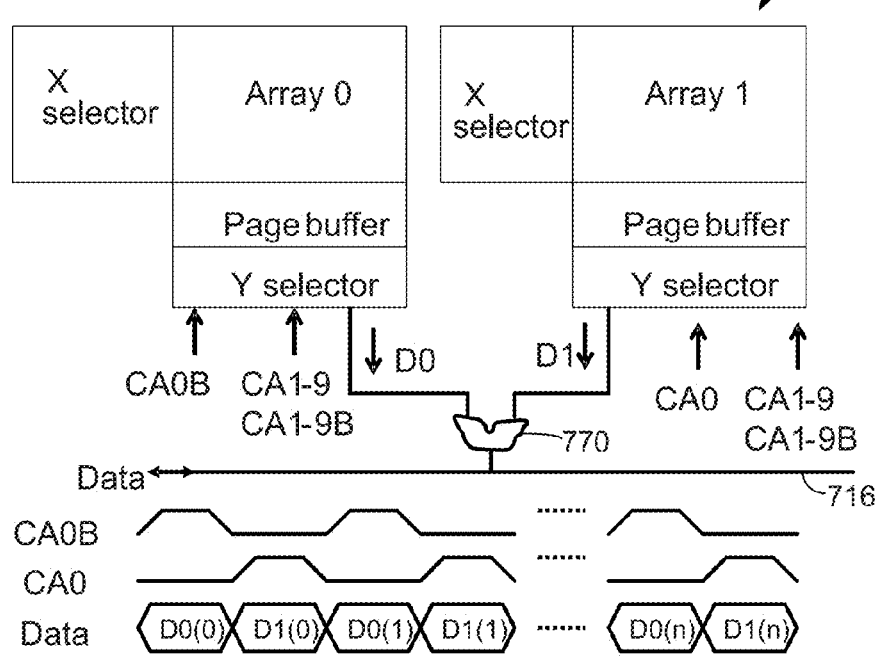
FIG. 7 schematically illustrates an example arrangement for memory access according to the first embodiment, in accordance with some embodiments.

FIG. 6 schematically illustrates an example memory access scheme 600 according to a first embodiment, in accordance with some embodiments. Restructuring data on a tile block basis may provide a user with an option to increase bandwidth with more energy per bit according to the first embodiment or to use less energy per bit with reduced bandwidth according to a second embodiment. FIGS. 6 and 7 describe the first embodiment to provide faster data bandwidth with more energy per bit and FIGS. 8-9 describe the second embodiment to provide lower energy per bit with slower data bandwidth. For example, the first embodiment may be used for high performance applications (e.g., solid state drive (SSD) in a data center) while the second embodiment may allow longer battery life for lower power applications (e.g., mobile secure digital (SD) card).

The scheme 600 may include data structuring techniques performed in connection with two or more arrays such as, for example, Array 0 and Array 1, which may each comport with embodiments described in connection with FIGS. 3-5. The tiles (e.g., Tile 0, Tile 1, Tile 2, Tile 3, etc.) may include tile blocks addressable by block (e.g., Blk 0, Blk 1, Blk 2 . . . Blk 7, etc.) of Array 0 (e.g., first group of tile blocks) and Array 1 (e.g., second group of tile blocks).

In the depicted embodiment, the highlighted tile blocks indicate example selected tile blocks for data access (e.g., read or write). According to various embodiments, data may be transferred to or from (to/from) selected tile blocks of multiple arrays in a sequence such that all tile blocks within a tile are transferred prior to transferring data from any other tiles. After data is transferred for all selected tile blocks within a tile of Array 0 and Array 1, data is transferred for all selected tile blocks within a subsequent tile of Array 0 and Array 1. For example, in the depicted embodiment, the data (e.g., DATA of FIG. 6) may be transferred in a sequence as follows: data transferred to/from Tile 0 of Array 0 (D0(0)), followed by data to/from Tile 0 of Array 1 (D1(0)), followed by data to/from Tile 1 of Array 0 (D0(1)), followed by data to/from Tile 1 of Array 1 (D1(1)) and so forth through Tile 2 and Tile 3 in a similar fashion. In some embodiments, the data restructuring module (e.g., data restructuring module 550 of FIG. 5) may be configured to modify an order of memory access data such that data addressed to a first tile (e.g., Tile 0) of Array 1 is configured for transfer immediately subsequent to transfer of data addressed to the first tile (e.g., Tile 0) of Array 0, and so forth according to the sequence described in this paragraph. In some embodiments, no wait period is designated between data addressed to different tile blocks in the structured data for memory access. For example, no wait period may exist between the data addressed to Tile 0 of Array 0 (D0(0)) and the data addressed to Tile 0 of Array 1 (D1(1)). In some embodiments, a wait period may correspond with a time period that is equal to a clock (CLK) cycle or greater. The clock may operate at a first higher I/O frequency (F1) based on the first mode of operation.

FIG. 7 schematically illustrates an example arrangement 700 for memory access according to the first embodiment, in accordance with some embodiments. In the arrangement 700, Array 0 may be coupled with an X selector, Y selector and page buffer and may be addressable according to a first column address CA0B where CA0-9 represent an example 10-bit column address CA<9:0>. CA1-9B may be complementary to CA0-9 and CAB<9:0>, for example, CA7B=0 when CA7=1. Array 1 may be coupled with an X selector, Y selector and page buffer and may be addressable according to a second column address CA0. Each array (e.g., Array 1) may correspond with tile blocks 402 of FIG. 4, each X selector may correspond with one or more tile block decoder/address latches 414 of FIG. 4, each Y selector may correspond with column select module 420 of FIG. 4 and each page buffer may correspond with sense and data latch module 422 of FIG. 4. The column address information (e.g., CA0, CA1-9, CA1-9B) may be input to the Y selector by a module such as, for example, data/address control module 410 of FIG. 4. The data (D0) addressed for access of tile blocks in Array 0 may be routed between a data bus 716 and Array 0 through an interleaver 770 such as, for example, a switch, multiplexer or demultiplexer, as can be seen.

Example waveforms are depicted for the first column address CA0B and the second column address CA0 below the arrangement 700 in FIG. 7. As an input/output (I/O) frequency becomes faster, more tiles may be selected for reading and/or writing data using an interleaving technique to facilitate arrangement of data of a tile block of Array 0 to be directly followed by data from a tile block of Array 1 to provide a data sequence with no wait period between adjacent data. For example, D0(0) may be directly followed by D1(0), D0(1), D1(1), and so forth, up to an nth tile (D0(n)), D1(n)). In some embodiments, such technique may be used for three or more arrays according to similar principles. Thus, in other words and according to various embodiments, a data restructuring module (e.g., data restructuring module 550 of FIG. 5) may be configured to modify an order of the data such that data addressed to a subsequent tile (e.g., Tile 1) of an initial group (e.g., Array 0) is configured for transfer immediately subsequent to transfer of data addressed to a preceding tile (e.g., Tile 0) of a subsequent group (e.g., Array 1) and data addressed to the subsequent tile (e.g., Tile 1) of the subsequent group (e.g., Array 1) is configured for transfer immediately subsequent to transfer of data addressed to the subsequent tile (e.g., Tile 1) of the initial group (e.g., Array 0).

Figure 8:
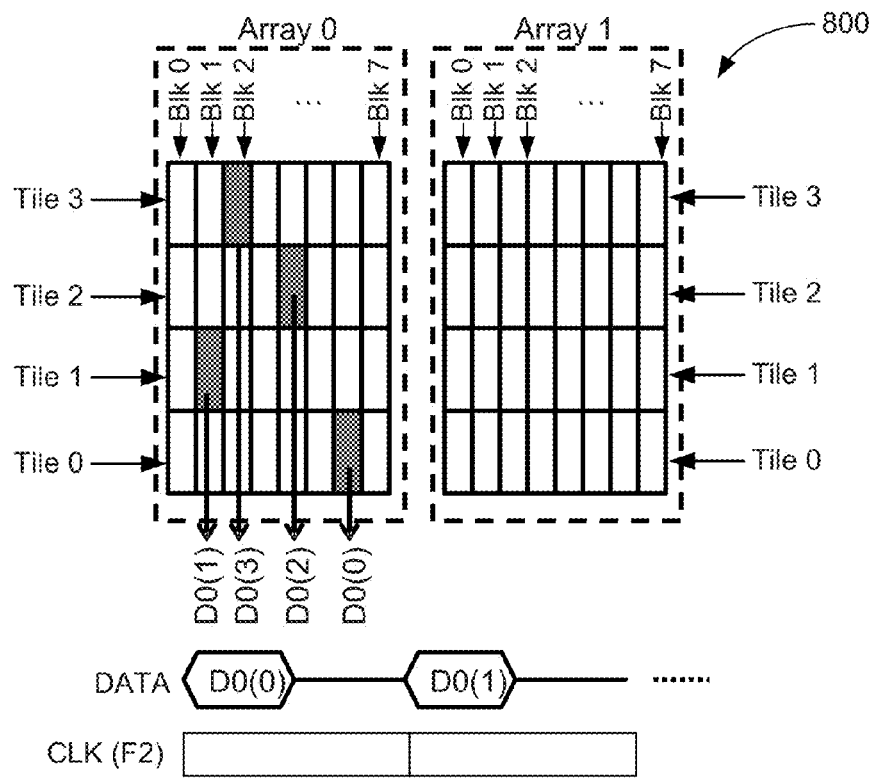
FIG. 8 schematically illustrates an example memory access scheme according to a second embodiment, in accordance with some embodiments.
Figure 9:
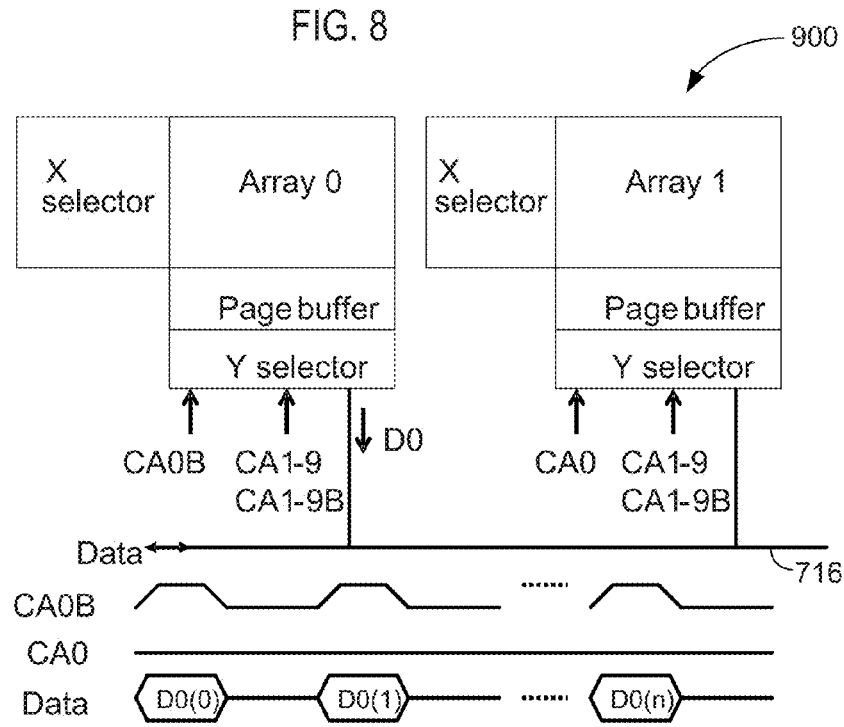
FIG. 9 schematically illustrates an example arrangement for memory access according to the second embodiment, in accordance with some embodiments.

FIG. 8 schematically illustrates an example memory access scheme 800 according to a second embodiment, in accordance with some embodiments. FIGS. 8-9 describe a second embodiment to provide lower energy per bit with slower data bandwidth relative to the first embodiment described in FIGS. 6-7. The tiles (e.g., Tile 0, Tile 1, Tile 2, Tile 3, etc.) may include tile blocks addressable by block (e.g., Blk 0, Blk 1, Blk 2 . . . Blk 7, etc.) of Array 0 and Array 1. In some embodiments, at least one tile (e.g., Tile 0) includes tile blocks of Array 0 and Array 1 in some embodiments. Tile blocks of Array 0 and Array 1 may be addressable by a same tile.

According to the second embodiment, only tile blocks in Array 0 are enabled for transfer of data. In a case where page data corresponds to Array 0, Array 1 may not need to be supplied with power, resulting in lower energy per bit and less disturbance to the memory cells of Array 1. Data from only Array 0 may be transferred (e.g., to the memory controller) and a wait period may be designated between adjacent data of tile blocks of Array 0. In some embodiments, only a single wait period may exist between adjacent data. In some embodiments, a single wait period may correspond with a time period that is equal to time to input/output data for a tile block (e.g., D0(0) or D0(1) in FIG. 8). Input and/or output of the data may be synchronized with a clock (CLK) whose frequency may vary depending on the mode of operation. The single wait period may correspond with half of a clock (CLK) cycle, or even greater, in some embodiments. The clock may operate at a second lower I/O frequency (F2) based on the second mode of operation.

FIG. 9 schematically illustrates an example arrangement 900 for memory access according to the second embodiment, in accordance with some embodiments. In the second embodiment, Array 0 and Array 1 are coupled with a data bus 716. Example waveforms are depicted for a first column address CA0B corresponding with Array 0 and a second column address CA0 corresponding with Array 1 below the arrangement 700 in FIG. 7. As can be seen in the example waveforms, data is transferred for only Array 0 (D0). For example, D0(0) may be followed by D0(1) with a wait period between D0(0) and D0(1) and so forth up to an nth tile of Array 0 (D0(n)). According to various embodiments, a data restructuring module (e.g., data restructuring module 550 of FIG. 5) may be configured to modify an order of the data such that only data addressed to a single array (e.g., Array 0) is configured for transfer. In some embodiments, the single array is one of multiple arrays sharing one or more common tiles.

Figure 10:
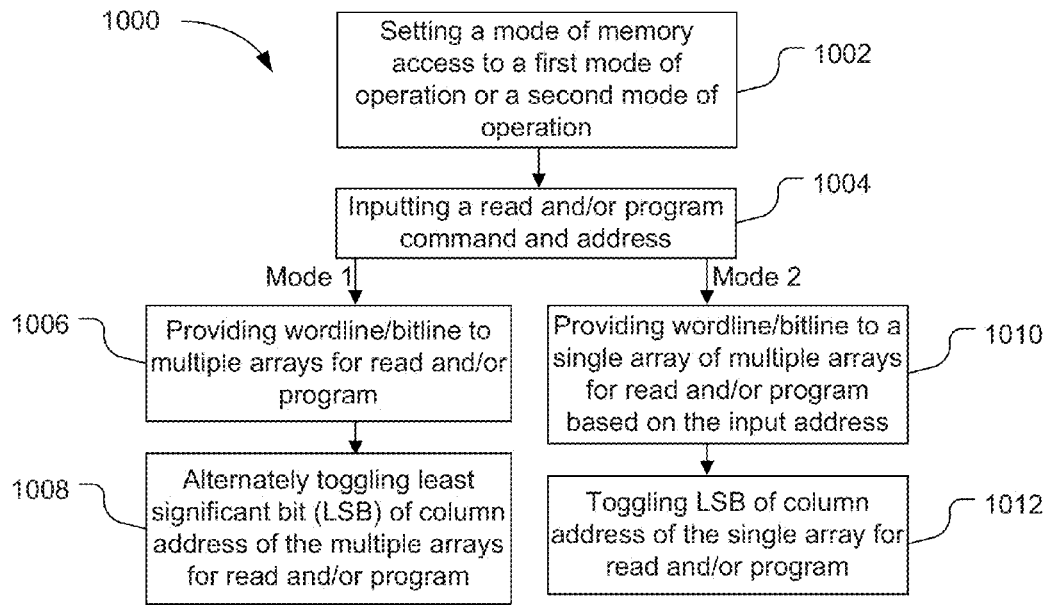
FIG. 10 is a flow diagram of a method for memory access according to the first embodiment or the second embodiment described in connection with FIGS. 7-9, in accordance with some embodiments.

FIG. 10 is a flow diagram of a method 1000 for memory access according to the first embodiment or the second embodiment described in connection with FIGS. 7-9, in accordance with some embodiments. In some embodiments, memory (e.g., memory die 300a of FIG. 3a) may be equipped with functionality such as, for example, a set feature command that allows a user or machine to set a first mode or second mode of operation according to the respective first embodiment described in connection with FIGS. 6-7 or the second embodiment described in connection with FIGS. 8-9. The actions of method 1000 may be performed by a memory controller or other suitable module that is part of memory or coupled with memory and configured to perform the actions.

At 1002, the method 1000 may include setting a mode of memory access to a first mode of operation (e.g., Mode 1) or a second mode of operation (e.g., Mode 2). In some embodiments, a user of the memory may select the mode of operation. In other embodiments, a machine (e.g., processor of a computing device) may select the mode of operation. The first mode of operation may correspond with the first embodiment described in connection with FIGS. 6-7 to provide faster data bandwidth with more energy per bit and the second mode of operation may correspond with the second embodiment described in connection with FIGS. 8-9 to provide lower energy per bit with slower data bandwidth relative to the first embodiment.

A page map and I/O frequency for read and/or write operations of may depend on whether the first mode of operation or second mode of operation is set. For example, a first page map may be used in connection with a first higher I/O frequency (F1) based on the first mode of operation and a second page map may be used in connection with a second lower I/O frequency (F2) based on the second mode of operation. Table 2 depicts an example address map that may be used in some embodiments based on whether the first mode is set (e.g., F1) or the second mode is set (e.g., F2). An address map may have other suitable values in other embodiments.

TABLE 2

Example Address Map

| | | |
|---|---|---|
| Frequency | F1 (e.g., 800 MHz) | F2 (e.g., 400 MHz) |
| Page Length | 1024 bytes | 512 bytes |
| Column Address LSB | CA0 | CA1 |
| Column Address MSB | CA9 | CA9 |
| # Pages | ~1,000 | ~2,000 |
| Page Address LSB | PA0 | CA0 |
| Page Address (next bit in sequence after LSB) | PA1 | PA0 |
| Page Address MSB | PA9 | PA9 |
| Operating current | 90 milliamp (mA) | 50 mA |

In some embodiments, a memory controller may be configured to set address mapping of a memory die according to a selected operation frequency (e.g., F1 or F2). For example, for F1, ten column addresses (e.g., from CA0 to CA9) may be assigned for read and/or write operation. For F2, nine column addresses (e.g., CA1 to CA9) may be assigned for read and/or write operation and CA0 may be assigned as LSB of page address. As can be seen, the page address PA0 to PA9 may be shifted accordingly in such a case.

At 1004, the method 1000 may include inputting a read and/or write command and address. In some embodiments, the command and address for read and/or write may input according to an arrangement (data restructuring) described in connection with FIGS. 5-9.

At 1006, if the first mode (Mode 1) is set at 1002, the method 1000 may include providing wordline/bitline to multiple arrays (e.g., Array 0 and Array 1 of FIG. 6) for read and/or write. For example, the wordline/bitline or other suitable indication of address may be provided or arranged according to embodiments described in connection with the first embodiment of FIGS. 6-7. Further, at 1008, if the first mode is set at 1002, the method 1000 may include alternately toggling LSB of column address of the multiple arrays for read and/or write. For example, the LSB of column address of the multiple arrays may be toggled alternately between a first array (e.g., Array 0) and a second array (e.g., Array 1) to provide interleaved data for memory access (e.g., input or output) as described and depicted in connection with FIG. 7.

At 1010, if the second mode (Mode 2) is set at 1002, the method 1000 may include providing wordline/bitline to a single array (e.g., Array 0 of FIG. 8) of multiple arrays (e.g., Array 0 and Array 1 of FIG. 8) for read and/or write. For example, the wordline/bitline or other suitable indication of address may be provided or arranged according to embodiments described in connection with the second embodiment of FIGS. 8-9. Further, at 1012, if the second mode is set at 1002, the method 1000 may include toggling LSB of column address of the single array for read and/or write. For example, the LSB of column address of the single may be toggled to provide data for memory access as described and depicted in connection with FIG. 9.

Figure 11:
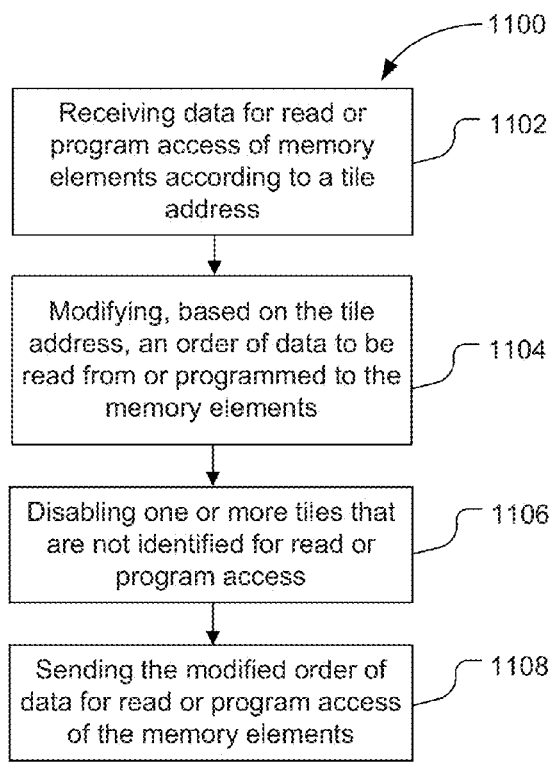
FIG. 11 is a flow diagram of a method for structuring data for memory access, in accordance with some embodiments.

FIG. 11 is a flow diagram of a method 1100 for structuring data for memory access, in accordance with some embodiments. The method 1100 may comport with actions described in connection with FIGS. 1-10 and vice versa. The actions of method 1100 may be performed by a memory controller and/or data restructuring module 550 of FIG. 5 in some embodiments.

At 1102, the method 1100 may include receiving data for read or write access of memory elements according to a tile address. The tile address may identify a tile of a plurality of tiles. In some embodiments, the received data may further include a block address to identify a block of a plurality of blocks. The tile address and block address may be used to identify a tile block of a plurality of tile blocks for memory access. An individual tile of the plurality of tiles may include two or more tile blocks of the plurality of tile blocks and the two or more tile blocks may include discrete memory elements of the memory elements.

At 1104, the method 1100 may include modifying, based on the tile address, an order of data to be read from or written to the memory elements. In some embodiments, modifying may include restructuring data into multiple data sets where each data set has a same data size as an individual tile block of the plurality of tile blocks. In some embodiments, modifying may further or alternatively include allocating only tile addresses that are different from one another into individual data sets of multiple data sets (e.g., as described in connection with data sets 555, 565 of FIG. 5).

In some embodiments, modifying the order of data may comport with embodiments described in connection with the first embodiment of FIGS. 6-7. For example, modifying the order of data may further include arranging data addressed to a first tile of the second array for transfer immediately subsequent to transfer of data addressed to the first tile of the first array (e.g., as described in connection with FIG. 7). In such embodiment, modifying may further include providing no wait period between adjacent data. For example, no wait period may be designated between data addressed to the first tile of the first array and the data addressed to the first tile of the second array. Further, in such embodiment, modifying may further include arranging data addressed to a second tile of the first array for transfer subsequent to transfer of data addressed to the first tile of the second array and arranging data addressed to the second tile of the second array for transfer subsequent to transfer of data addressed to the second tile of the first array (e.g., as described in connection with FIG. 7).

In other embodiments, modifying the order of data may comport with embodiments described in connection with the second embodiment of FIGS. 8-9. For example, modifying the order of data may further include providing a single wait period between the data addressed to a first tile of a first array and data addressed to a second tile of a second array. The order of data may be modified such that only data addressed to the first array is configured for transfer.

At 1106, the method 1100 may include disabling one or more tiles that are not identified for read or write access. Disabling one or more tiles as described may reduce read or write operation time and/or power consumed to perform such operations.

At 1108, the method 1100 may include sending the modified order of data for read or write access of the memory elements. The memory access data (e.g., command and address) may be input to memory for performance of read and/or write operations.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments. Suitable combinations of techniques described herein may be implemented in some embodiments.

An article of manufacture is disclosed. The article of manufacture may include, for example, non-transitory machine-readable storage having instructions stored thereon, that when executed, cause actions to be performed as described herein.

Figure 12:
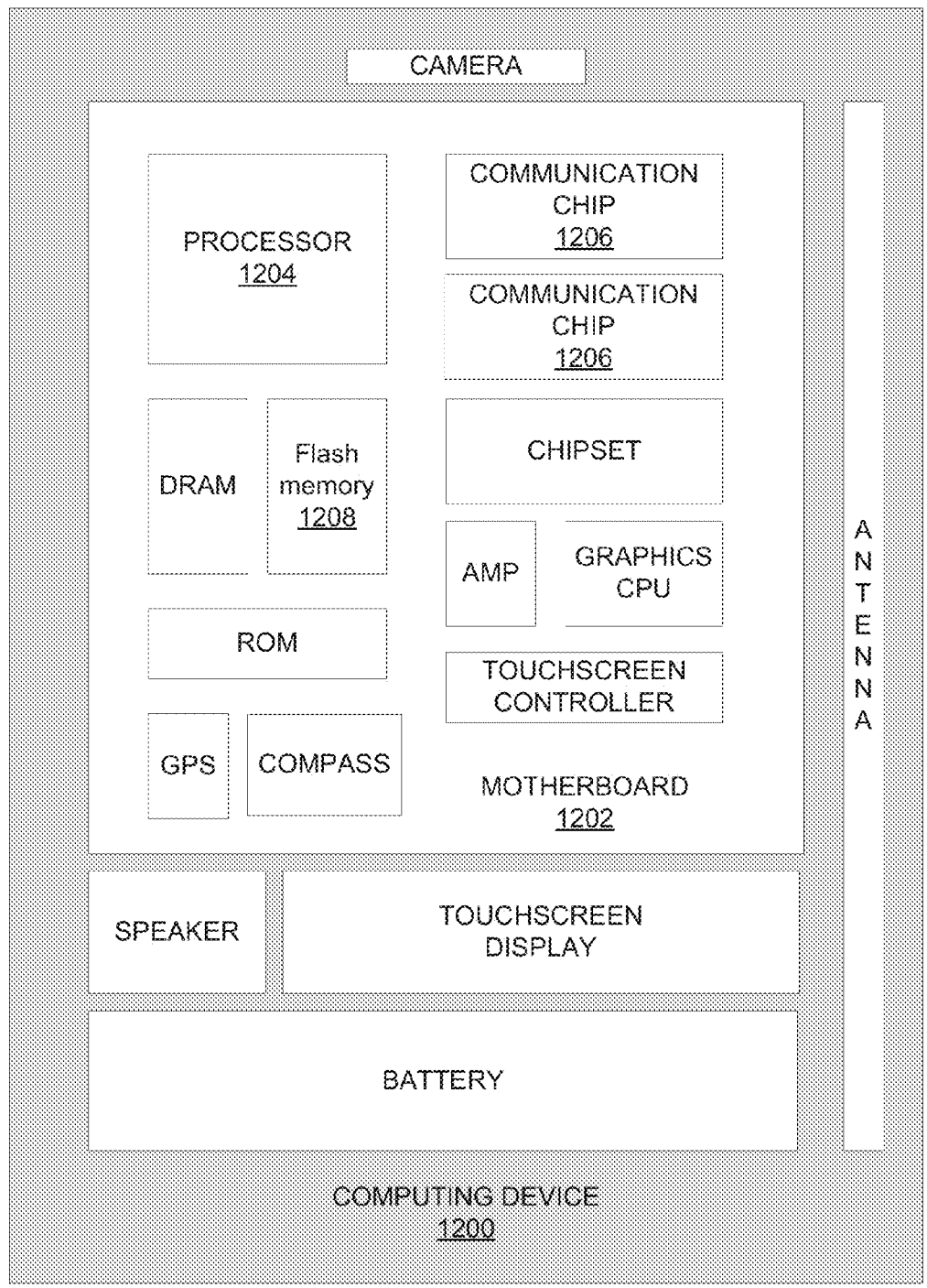
FIG. 12 schematically illustrates an example system that may include memory components configured to perform actions as described herein, in accordance with some embodiments.

Embodiments of the present disclosure may be implemented into a system using any suitable hardware and/or software to configure as desired. FIG. 12 schematically illustrates an example system (e.g., computing device 1200) that may include memory components configured to perform actions as described herein, in accordance with some embodiments. The computing device 1200 may house a board such as motherboard 1202. The motherboard 1202 may include a number of components, including but not limited to a processor 1204 and at least one communication chip 1206. The processor 1204 may be physically and electrically coupled to the motherboard 1202. The term "processor" may refer to any device or portion of a device that processes electronic data from registers and/or memory to transform that electronic data into other electronic data that may be stored in registers and/or memory. In some implementations, the at least one communication chip 1206 may also be physically and electrically coupled to the motherboard 1202. In further implementations, the communication chip 1206 may be part of the processor 1204. In some embodiments, the computing device 1200 includes flash memory 1208 and/or other related components (e.g., memory controller) physically and electrically coupled to the motherboard 1202.

The flash memory 1208 of the computing device 1200 may be packaged in an IC assembly (e.g., IC assembly 200 of FIG. 2) that includes the flash memory 1208 configured to perform actions as described herein, in accordance with some embodiments. For example, the circuit board 122 of FIG. 2 may be a motherboard 1202 and the flash memory 1208 may be embodied in a die 102 mounted on a package substrate 121 as depicted in FIG. 1. The package substrate 121 and the motherboard 1202 may be coupled together using package-level interconnects. In other embodiments, another memory device of the computing device 1200 may be configured to actions as described herein, in accordance with some embodiments. In some embodiments, the flash memory 1208 may be integrated and/or otherwise combined with the processor 1204, the communication chip 1206 or another die of the computing device 1200.

Depending on its applications, computing device 1200 may include other components that may or may not be physically and electrically coupled to the motherboard 1202. These other components may include, but are not limited to, volatile memory (e.g., DRAM), non-volatile memory (e.g., ROM or flash memory), memory controller, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1206 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1206 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1206 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1206 may operate in accordance with other wireless protocols in other embodiments.

The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

In various implementations, the computing device 1200 may be mobile computing device, a laptop, a netbook, a notebook, an ultrabook, a smart phone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

EXAMPLES

According to various embodiments, the present disclosure describes an apparatus. Example 1 of the apparatus includes a plurality of tiles, a plurality of blocks, wherein individual tiles of the plurality of tiles and individual blocks of the plurality of blocks each include a plurality of tile blocks having memory elements and wherein the plurality of tile blocks are accessible for read or write according to a tile address to identify a tile of the plurality of tiles and a block address to identify a block of the plurality of blocks and a data restructuring module configured to modify, based on the tile address, an order of data to be read from or written to the tile blocks. Example 2 may include the apparatus of Example 1, wherein the data restructuring module is configured to disable tile blocks of one or more tiles of the plurality of tiles that are not identified for read or write access during a read or write operation of one or more other tile blocks. Example 3 may include the apparatus of Example 1, wherein the data restructuring module is configured to restructure data into multiple data sets and each data set of the multiple data sets has a same data size as an individual tile block of the plurality of tile blocks. Example 4 may include the apparatus of Example 3, wherein the data restructuring module is configured to allocate only tile addresses that are different from one another into each individual data set of the multiple data sets. Example 5 may include the apparatus of any of Examples 1-4, wherein the plurality of tile blocks include a first array of tile blocks and a second array of tile blocks and the data restructuring module is configured to modify an order of the data such that data addressed to a first tile of the second array is configured for transfer immediately subsequent to transfer of data addressed to the first tile of the first array. Example 6 may include the apparatus of Example 5, wherein no wait period exists between the data addressed to the first tile of the first array and the data addressed to the first tile of the second array and the data restructuring module is configured to modify an order of the data such that data addressed to a second tile of the first array is configured for transfer subsequent to transfer of data addressed to the first tile of the second array and data addressed to the second tile of the second array is configured for transfer subsequent to transfer of data addressed to the second tile of the first array. Example 7 may include the apparatus of any of Examples 1-4, wherein the plurality of blocks include a first array of blocks and a second array of blocks, a single wait period exists between data addressed to a first tile of the first array and subsequent data addressed to a second tile of the first array and the data restructuring module is configured to modify an order of the data such that only data addressed to the first array is configured for transfer. Example 8 may include the apparatus of any of Examples 1-4, wherein the memory elements comprise multi-level cells of a flash memory die and the data restructuring module comprises circuitry of the flash memory die. Example 9 may include the apparatus of any of Examples 1-4, further comprising a tile block latch coupled with an individual tile block of the plurality of tile blocks, the tile block latch configured to select the individual tile blocks for read or write access. Example 10 may include the apparatus of Example 9, further comprising a wordline coupled with each tile block latch and multiple bitlines coupled with each individual tile block of the plurality of tile blocks.

According to various embodiments, the present disclosure describes a method. Example 11 of the method includes a method comprising receiving data for read or write access of memory elements of one or more tile blocks of a plurality of tile blocks, wherein the one or more tile blocks are addressable according to a tile address to identify a tile of a plurality of tiles and a block address to identify a block of a plurality of blocks wherein individual tiles of the plurality of tiles and individual blocks of the plurality of blocks each include tile blocks of the plurality of tile blocks and modifying, based on the tile address, an order of data to be read from or written to the tile blocks. Example 12 may include the method of Example 11, wherein modifying, based on the tile address, an order of data comprises restructuring data into multiple data sets, wherein each data set of the multiple data sets has a same data size as an individual tile block of the plurality of tile blocks. Example 13 may include the method of Example 12, wherein modifying, based on the tile address, an order of data comprises allocating only tile addresses that are different from one another into each individual data set of the multiple data sets. Example 14 may include the method of any of Examples 11-13, wherein the plurality of tile blocks include a first array of tile blocks and a second array of tile blocks and modifying, based on the tile address, an order of data comprises arranging data addressed to a first tile of the second array for transfer immediately subsequent to transfer of data addressed to the first tile of the first array. Example 15 may include the method of Example 14, wherein modifying, based on the tile address, an order of data comprises providing no wait period between the data addressed to the first tile of the first array and the data addressed to the first tile of the second array, arranging data addressed to a second tile of the first array for transfer subsequent to transfer of data addressed to the first tile of the second array and arranging data addressed to the second tile of the second array for transfer subsequent to transfer of data addressed to the second tile of the first array. Example 16 may include the method of any of Examples 11-13, wherein the plurality of blocks include a first array of tile blocks and a second array of tile blocks, modifying, based on the tile address, an order of data comprises providing a single wait period between the data addressed to a first tile of the first array and data addressed to a second tile of the first array and the data restructuring module is configured to modify an order of the data such that only data addressed to the first array is configured for transfer. Example 17 may include the method of any of Examples 11-13, further comprising disabling tile blocks of one or more tiles of the plurality of tiles that are not identified for read or write access during a read or write operation of one or more other tile blocks. Example 18 may include the method of any of Examples 11-13, further comprising sending the modified order of data for read or write access of the memory elements.

According to various embodiments, the present disclosure describes a system (e.g., computing device). Example 19 of a computing device includes memory including a plurality of tiles, and a plurality of blocks, wherein individual tiles of the plurality of tiles and individual blocks of the plurality of blocks each include a plurality of tile blocks having memory elements and wherein the plurality of tile blocks are accessible for read or write according to a tile address to identify a tile of the plurality of tiles and a block address to identify a block of the plurality of blocks and a memory controller having a data restructuring module configured to modify, based on the tile address, an order of data that is to be transferred to or from the tile blocks. Example 20 may include the computing device of Example 19, wherein the memory controller and the memory are components of a same die. Example 21 may include the computing device of any of Examples 19-20, further comprising random access memory (RAM) coupled with the memory controller and configured to store information associated with modification of the order of data by the data restructuring module.

According to various embodiments, the present disclosure describes a storage medium having machine-readable instructions. Example 22 includes a storage medium having machine-readable instructions, when executed, to cause a data restructuring module of a memory device to receive data for read or write access of memory elements of one or more tile blocks of a plurality of tile blocks, wherein the one or more tile blocks are addressable according to a tile address to identify a tile of a plurality of tiles and a block address to identify a block of a plurality of blocks wherein individual tiles of the plurality of tiles and individual blocks of the plurality of blocks each include tile blocks of the plurality of tile blocks and modify, based on the tile address, an order of data to be read from or written to the tile blocks. Example 23 may include the non-transitory storage medium of Example 22, wherein the instructions, when executed, further cause the data restructuring module to restructure the data into multiple data sets, wherein each data set of the multiple data sets has a same data size as an individual tile block of the plurality of blocks. Example 24 may include the non-transitory storage medium of Example 23, wherein the instructions, when executed, further cause the data restructuring module to allocate only tile addresses that are different from one another into each individual data set of the multiple data sets. Example 25 may include the non-transitory storage medium of any of Examples 22-24, wherein the plurality of blocks include a first array of tile blocks and a second array of tile blocks and wherein the instructions, when executed, further cause the data restructuring module to arrange data addressed to a first tile of the second array for transfer immediately subsequent to transfer of data addressed to the first tile of the first array.

Various embodiments may include any suitable combination of the above-described embodiments including alternative (or) embodiments of embodiments that are described in conjunctive form (and) above (e.g., the "and" may be "and/or").

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising a three-dimensional (3D) memory array that includes:
a plurality of tiles;
a plurality of blocks, wherein individual tiles of the plurality of tiles and individual blocks of the plurality of blocks each include a plurality of tile blocks having memory elements, wherein the plurality of tile blocks include at least a first array of tile blocks and a second array of tile blocks, wherein the tile blocks are accessible for read or write according to a tile address to identify a tile of the plurality of tiles and a block address to identify a block of the plurality of blocks; and
a data restructuring module to modify, based on the tile address, an order of data to be read from or written to the tile blocks in a first mode at a first point in time and in a second mode at a second point in time that is different than the first point in time, wherein in the first mode data addressed to a first tile of the second array is to be transferred subsequent to transfer of data addressed to the first tile of the first array, data addressed to a second tile of the first array is to be transferred subsequent to transfer of data addressed to the first tile of the second array, and data addressed to the second tile of the second array is to be transferred subsequent to transfer of data addressed to the second tile of the first array, wherein in the second mode only data addressed to the first array is to be transferred and a power supply to the second array is disabled.

2. The apparatus of claim 1, wherein the data restructuring module is to disable tile blocks of one or more tiles of the plurality of tiles that are not identified for read or write access during a read or write operation of one or more other tile blocks.

3. The apparatus of claim 1, wherein:
the data restructuring module is to restructure data into multiple data sets; and
each data set of the multiple data sets has a same data size as an individual tile block of the plurality of tile blocks.

4. The apparatus of claim 3, wherein the data restructuring module is to allocate only tile addresses that are different from one another into each individual data set of the multiple data sets.

5. The apparatus of claim 1, wherein:
in the first mode, no wait period exists between the data addressed to the first tile of the first array and the data addressed to the first tile of the second array.

6. The apparatus of claim 1, wherein:
in the second mode, a single wait period exists between data addressed to the first tile of the first array and subsequent data addressed to the second tile of the first array.

7. The apparatus of claim 1, wherein:
the memory elements comprise multi-level cells of a flash memory die; and
the data restructuring module comprises circuitry of the flash memory die.

8. The apparatus of claim 1, further comprising:
a tile block latch coupled with an individual tile block of the plurality of tile blocks, to select the individual tile blocks for read or write access.

9. The apparatus of claim 8, further comprising:
a wordline coupled with each tile block latch; and
multiple bitlines coupled with each individual tile block of the plurality of tile blocks.

10. A method comprising:
receiving data for read or write access of memory elements of one or more tile blocks of a plurality of tile blocks of a three-dimensional (3D) memory array, wherein the one or more tile blocks are addressable according to a tile address to identify a tile of a plurality of tiles and a block address to identify a block of a plurality of blocks wherein individual tiles of the plurality of tiles and individual blocks of the plurality of blocks each include tile blocks of the plurality of tile blocks, wherein the plurality of tile blocks include at least a first array of tile blocks and a second array of tile blocks; and
modifying, based on the tile address, an order of data to be read from or written to the tile blocks, in a first mode at a first point in time and in a second mode at a second point in time that is different than the first point in time, wherein modifying in the first mode includes arranging for transfer of data addressed to a first tile of the second array subsequent to transferring data addressed to the first tile of the first array, arranging for transfer of data addressed to a second tile of the first array subsequent to transferring data addressed to the first tile of the second array, and arranging for transfer of data addressed to the second tile of the second array subsequent to transferring data addressed to the second tile of the first array, wherein modifying in the second mode includes arranging for transfer of data addressed to the first array and disabling a power supply to the second array.

11. The method of claim 10, wherein modifying, based on the tile address, an order of data comprises restructuring data into multiple data sets, wherein each data set of the multiple data sets has a same data size as an individual tile block of the plurality of tile blocks.

12. The method of claim 11, wherein modifying, based on the tile address, an order of data comprises allocating only tile addresses that are different from one another into each individual data set of the multiple data sets.

13. The method of claim 10, wherein modifying in the first mode, based on the tile address, an order of data comprises:
providing no wait period between the data addressed to the first tile of the first array and the data addressed to the first tile of the second array.

14. The method of claim 10, wherein
modifying in the second mode, based on the tile address, an order of data comprises providing a single wait period between the data addressed to the first tile of the first array and data addressed to the second tile of the first array.

15. The method of claim 10, further comprising:
disabling tile blocks of one or more tiles of the plurality of tiles that are not identified for read or write access during a read or write operation of one or more other tile blocks.

16. The method of claim 10, further comprising:
sending the modified order of data for read or write access of the memory elements.

17. A computing device, comprising:
a three-dimensional (3D) memory array including:
a plurality of tiles, and
a plurality of blocks, wherein individual tiles of the plurality of tiles and individual blocks of the plurality of blocks each include a plurality of tile blocks having memory elements and wherein the plurality of tile blocks include at least a first array of tile blocks and a second array of tile blocks, wherein the tile blocks are accessible for read or write according to a tile address to identify a tile of the plurality of tiles and a block address to identify a block of the plurality of blocks; and a memory controller having a data restructuring module to modify, based on the tile address, an order of data that is to be transferred to or from the tile blocks in a first mode at a first point in time and in a second mode at a second point in time that is different than the first point in time, wherein in the first mode data addressed to a first tile of the second array is to be transferred immediately subsequent to transfer of data addressed to the first tile of the first array, data addressed to a second tile of the first array is to be transferred subsequent to transfer of data addressed to the first tile of the second array, and data addressed to the second tile of the second array is to be transferred subsequent to transfer of data addressed to the second tile of the first array, wherein in the second mode only data addressed to the first array is to be transferred and a power supply to the second array is disabled.

18. The computing device of claim 17, wherein the memory controller and the memory elements are components of a same die.

19. The computing device of claim 17, further comprising:
random access memory (RAM) coupled with the memory controller and to store information associated with modification of the order of data by the data restructuring module.

* * * * *